(12) United States Patent
Cho et al.

(10) Patent No.: US 11,231,443 B2
(45) Date of Patent: Jan. 25, 2022

(54) SEMICONDUCTOR DEVICE TEST SOCKET

(71) Applicant: MICRO FRIEND CO., LTD, Seoul (KR)

(72) Inventors: Yong Ho Cho, Gyeonggi-do (KR); Sang Hee Park, Gyeonggi-do (KR)

(73) Assignee: MICRO FRIEND CO., LTD, Seoul (KR)

( * ) Notice: Subject to any disclaimer, the term of this patent is extended or adjusted under 35 U.S.C. 154(b) by 568 days.

(21) Appl. No.: 16/094,258

(22) PCT Filed: Nov. 30, 2016

(86) PCT No.: PCT/KR2016/013983
§ 371 (c)(1),
(2) Date: Oct. 17, 2018

(87) PCT Pub. No.: WO2017/183788
PCT Pub. Date: Oct. 26, 2017

(65) Prior Publication Data
US 2021/0231705 A1    Jul. 29, 2021

(30) Foreign Application Priority Data

Apr. 21, 2016 (KR) ........................ 10-2016-0048763

(51) Int. Cl.
*G01R 1/04* (2006.01)
*G01R 3/00* (2006.01)
*G01R 31/28* (2006.01)

(52) U.S. Cl.
CPC ............. *G01R 1/0466* (2013.01); *G01R 3/00* (2013.01); *G01R 31/2863* (2013.01)

(58) Field of Classification Search
None
See application file for complete search history.

(56) References Cited

U.S. PATENT DOCUMENTS 5,385,477 A    1/1995   Vaynkof et al.
6,215,321 B1*  4/2001   Nakata ............... G01R 1/07378
                                                          324/756.03
(Continued)

FOREIGN PATENT DOCUMENTS

JP    H08288037 A   11/1996
JP    H1164442 A    3/1999
(Continued)

OTHER PUBLICATIONS

Japanese Office Action for Application No. 2018-555654 dated Jul. 15, 2020.
(Continued)

*Primary Examiner* — Jas A Sanghera
(74) *Attorney, Agent, or Firm* — Tarolli, Sundheim, Covell & Tummino LLP

(57) ABSTRACT

An embodiment of the present invention provides a test socket for a semiconductor device, comprising: a base layer having a first surface and a second surface opposite to the first surface, and having, on the second surface, an external connection pad formed at a pitch corresponding to an electrode terminal of a test board; a plurality of circuit patterns formed to be partially exposed on the surface of the base layer and rearranged at a pitch corresponding to the external connection pad; a plurality of electrode patterns formed on the first surface to be electrically connected to the circuit patterns and an external connection terminal of a semiconductor device, and arranged at a pitch corresponding to the external connection terminal; and an elastic layer covering the electrode patterns such that the electrode patterns are partially exposed.

15 Claims, 26 Drawing Sheets

(56) References Cited

U.S. PATENT DOCUMENTS

| | | | |
|---|---|---|---|
| 6,286,208 B1 | 9/2001 | Shih et al. | |
| 6,602,879 B2 | 8/2003 | Murthy et al. | |
| 2001/0053170 A1* | 12/2001 | Ohtaki | G01R 31/2863 |
| | | | 374/120 |
| 2002/0130676 A1* | 9/2002 | Beaman | G01R 1/07342 |
| | | | 324/755.08 |
| 2006/0043983 A1* | 3/2006 | Setaka | G01R 1/06711 |
| | | | 324/755.05 |
| 2007/0075726 A1* | 4/2007 | Chan | H05K 3/4007 |
| | | | 324/754.18 |

FOREIGN PATENT DOCUMENTS

| | | |
|---|---|---|
| JP | 2000502811 A | 3/2000 |
| JP | 2000502812 A | 3/2000 |
| JP | 2001249145 A | 9/2001 |
| JP | 2004347427 A | 12/2004 |
| JP | 2004347591 A | 12/2004 |
| JP | 2006349692 A | 12/2006 |
| JP | 2016035441 A | 3/2016 |
| KR | 200327630 Y1 | 9/2003 |
| KR | 20110083053 A | 7/2011 |
| KR | 20110090298 A | 8/2011 |
| KR | 101546363 B1 | 8/2015 |

OTHER PUBLICATIONS

International Search Report for corresponding International application No. PCT/KR2016/013983 dated Mar. 20, 2017.

* cited by examiner

[FIG. 1]
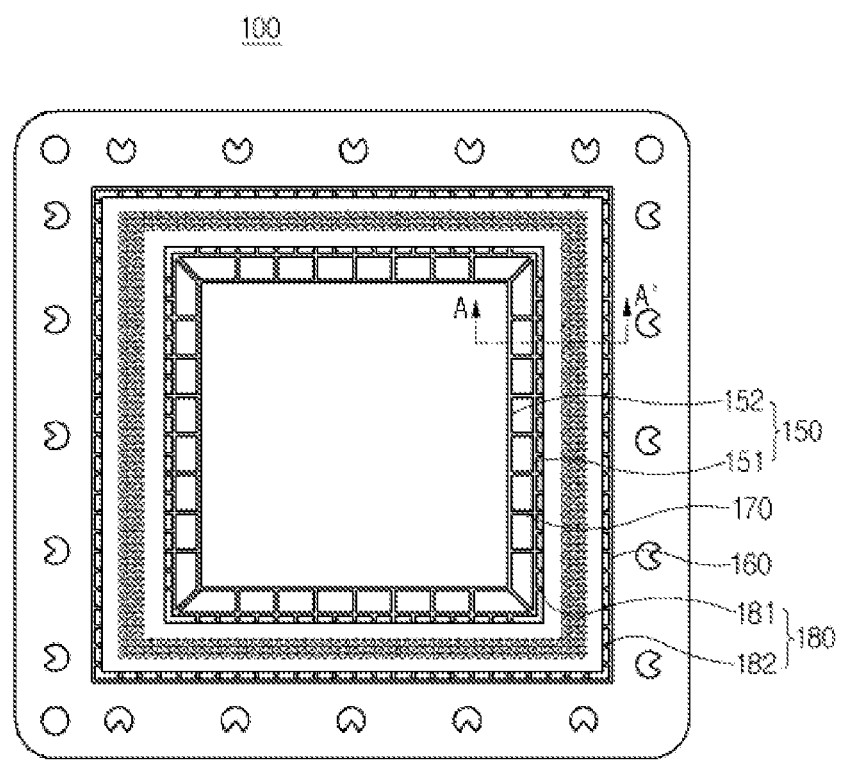

[FIG. 2]
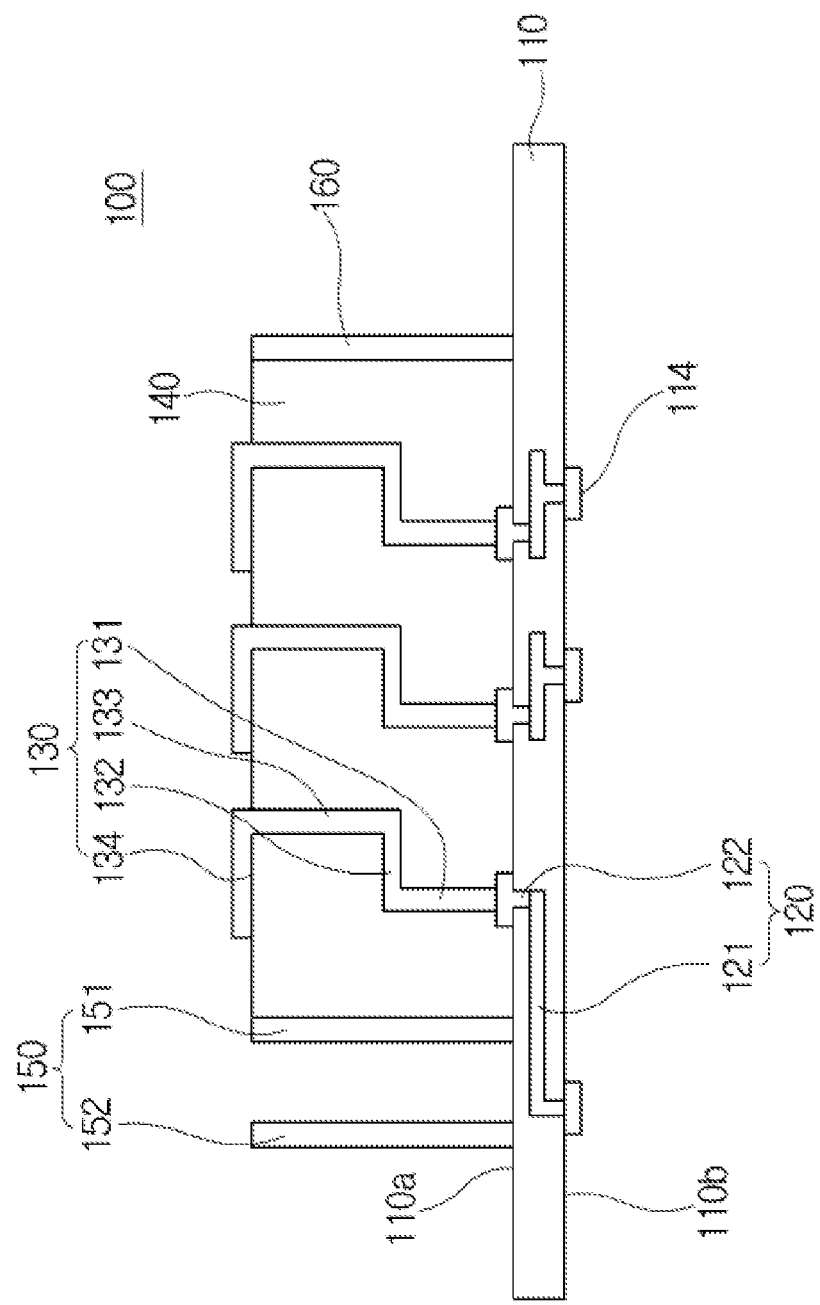

[FIG. 3]
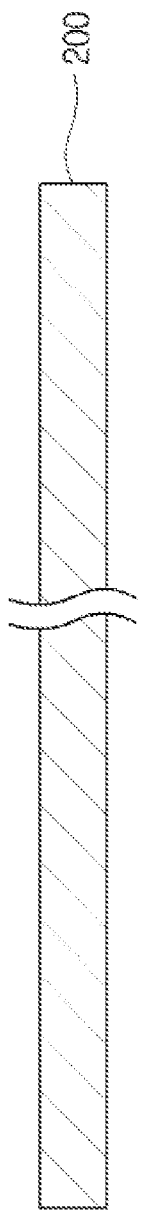

[FIG. 4]
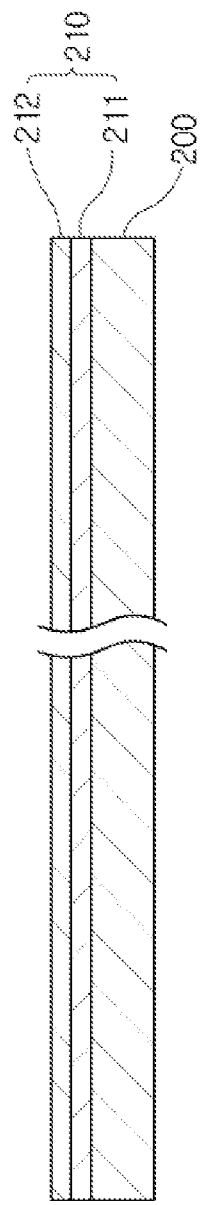

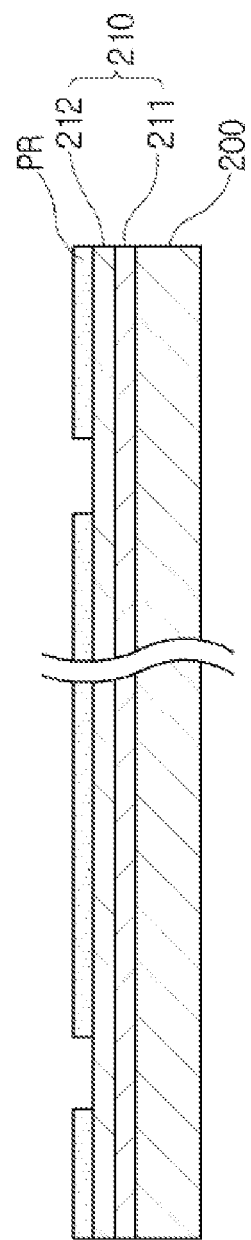
[FIG. 5]

[FIG. 6]
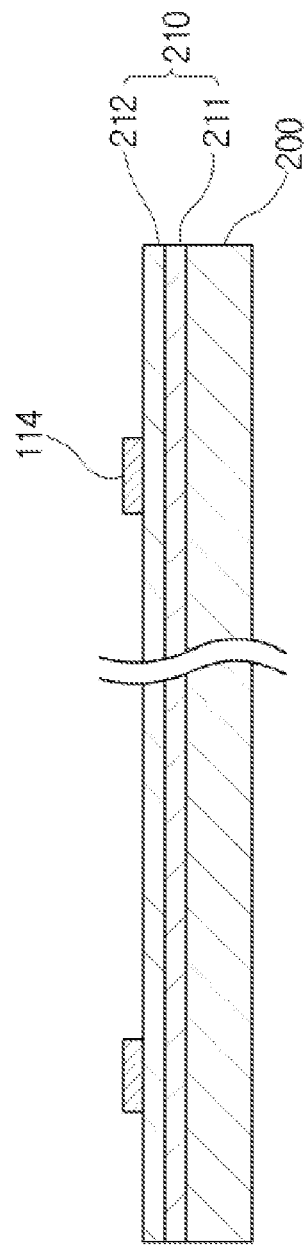

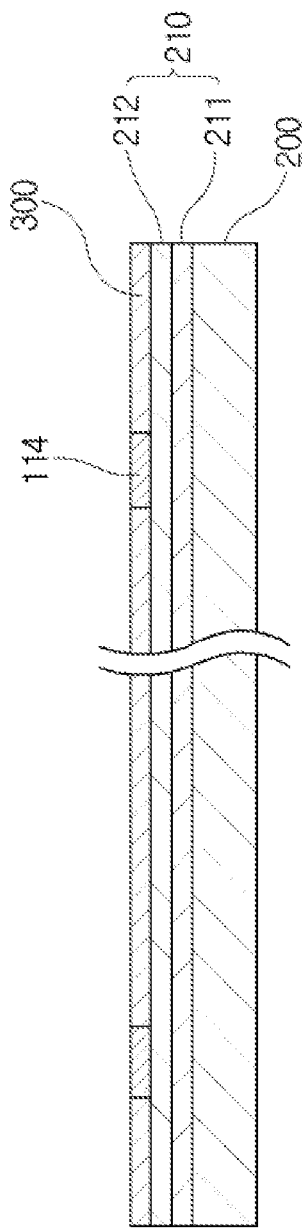
[FIG. 7]

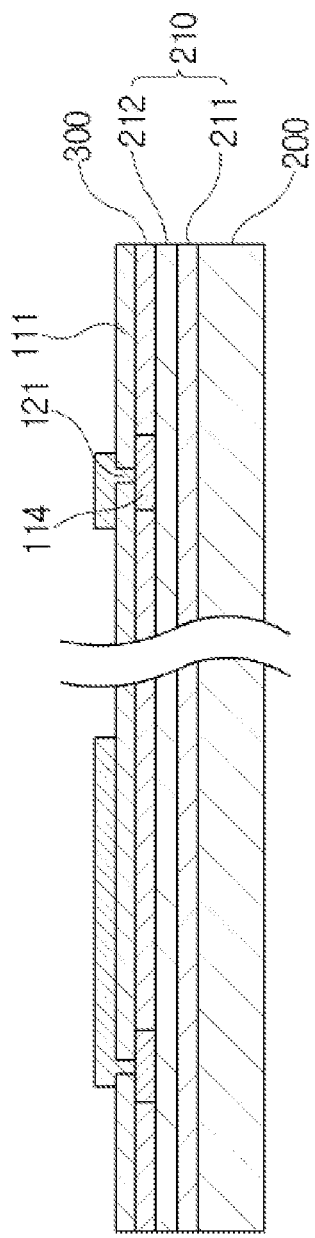
[FIG. 8]

[FIG. 9]
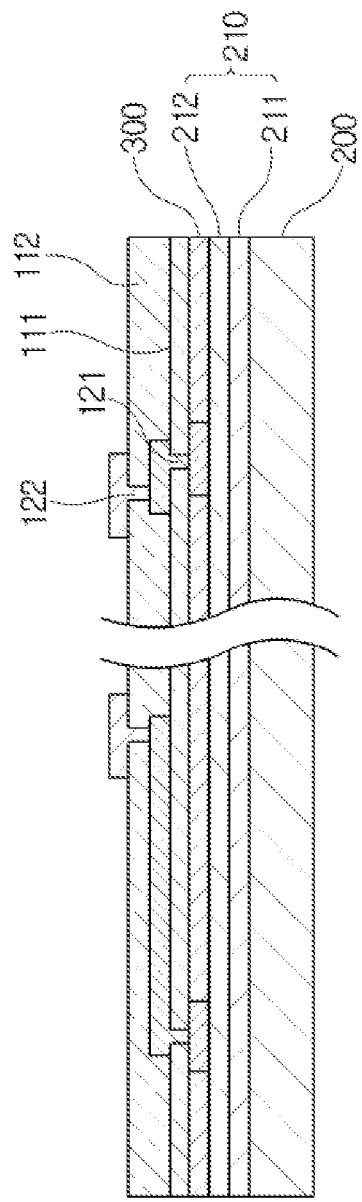

[FIG. 10]
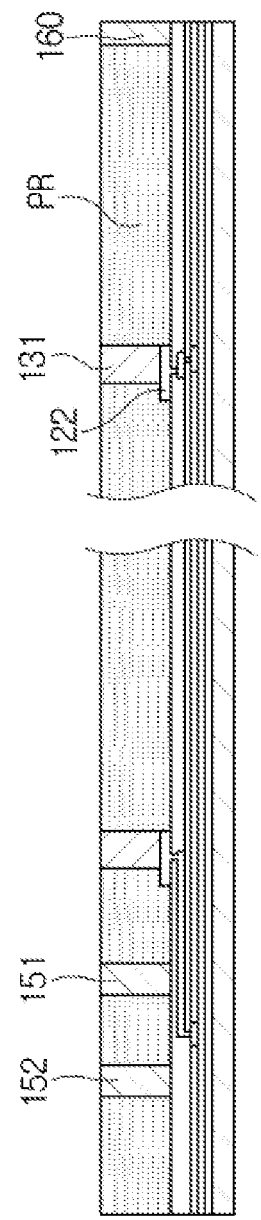

[FIG. 11]
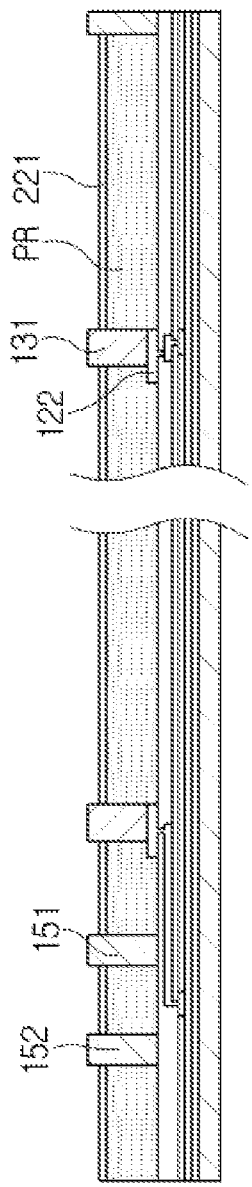

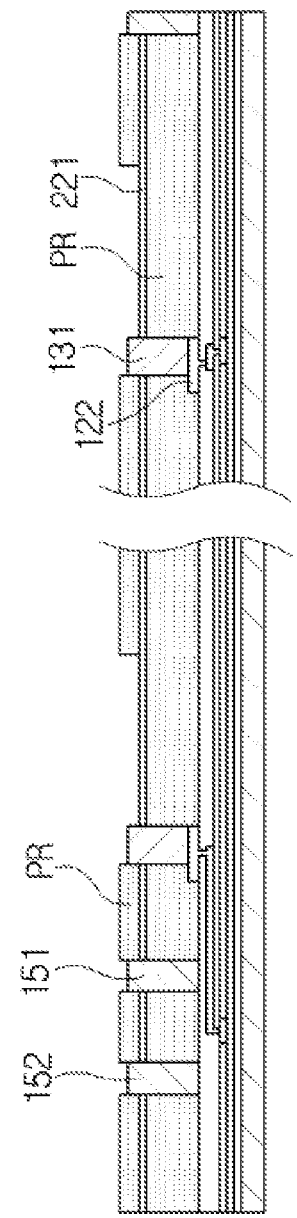
[FIG. 12]

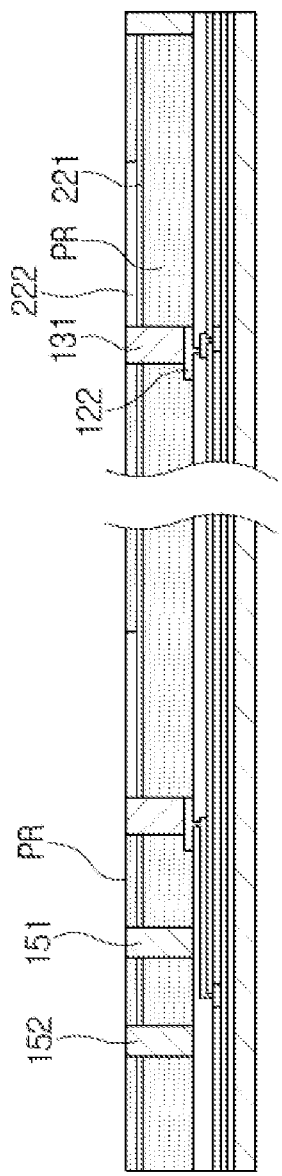
[FIG. 13]

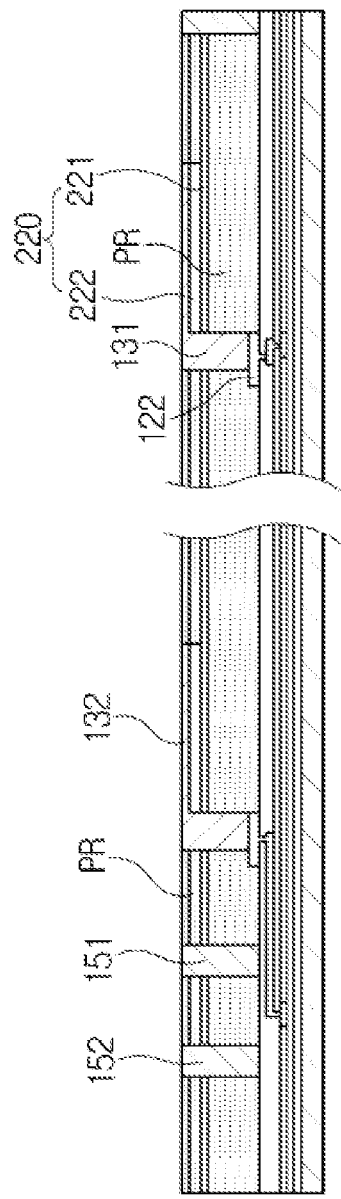
[FIG. 14]

[FIG. 15]
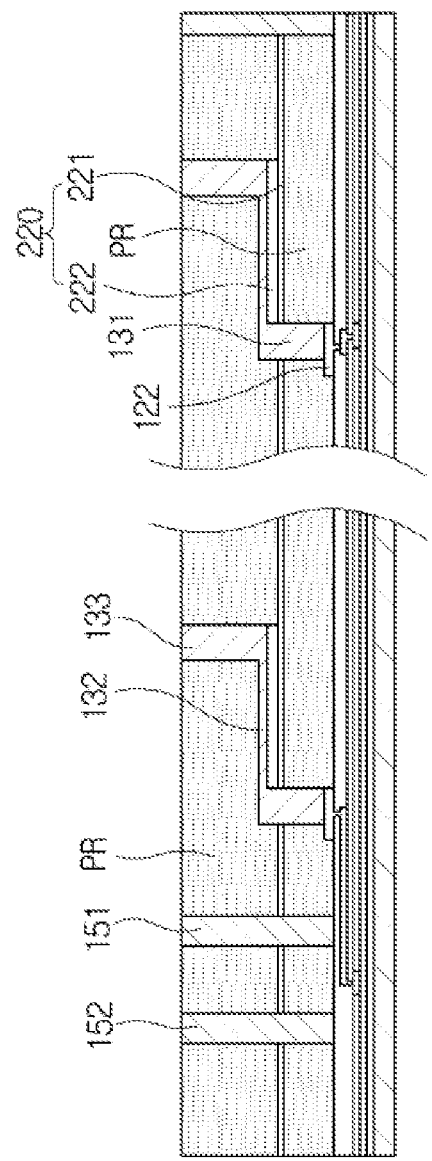

[FIG. 16]
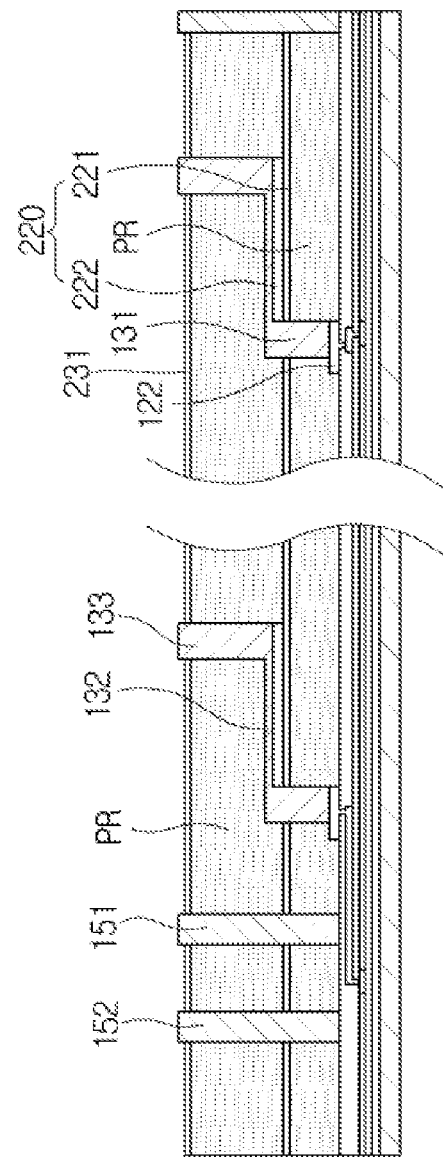

[FIG. 17]
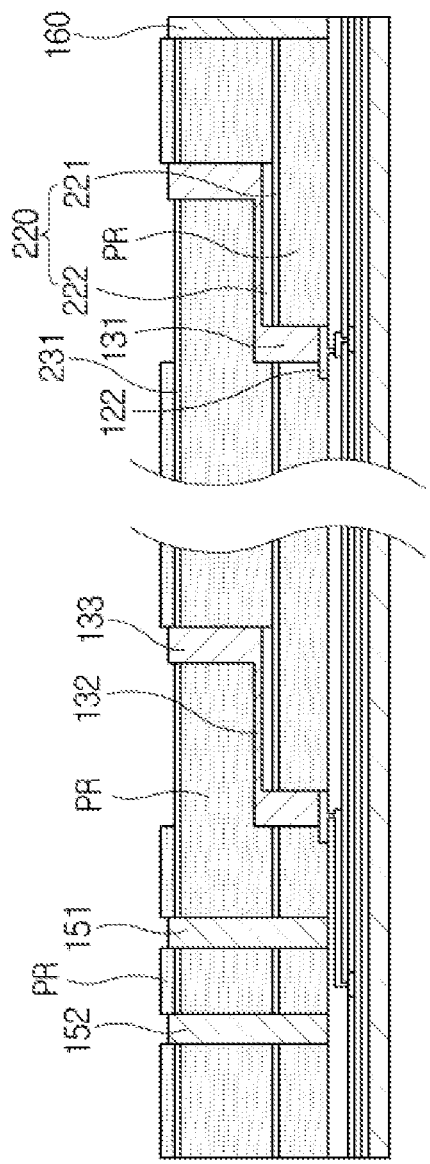

[FIG. 18]
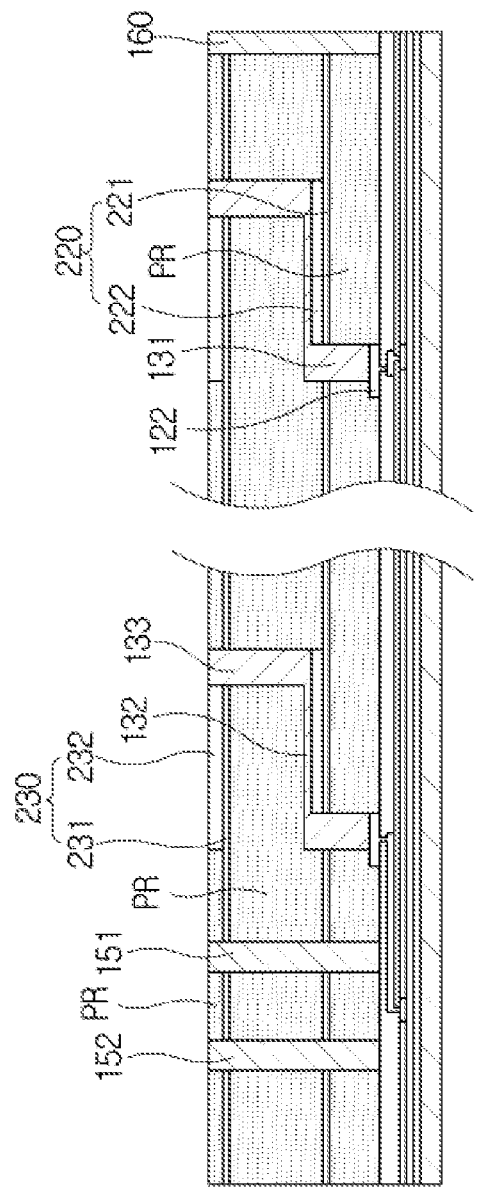

[FIG. 19]
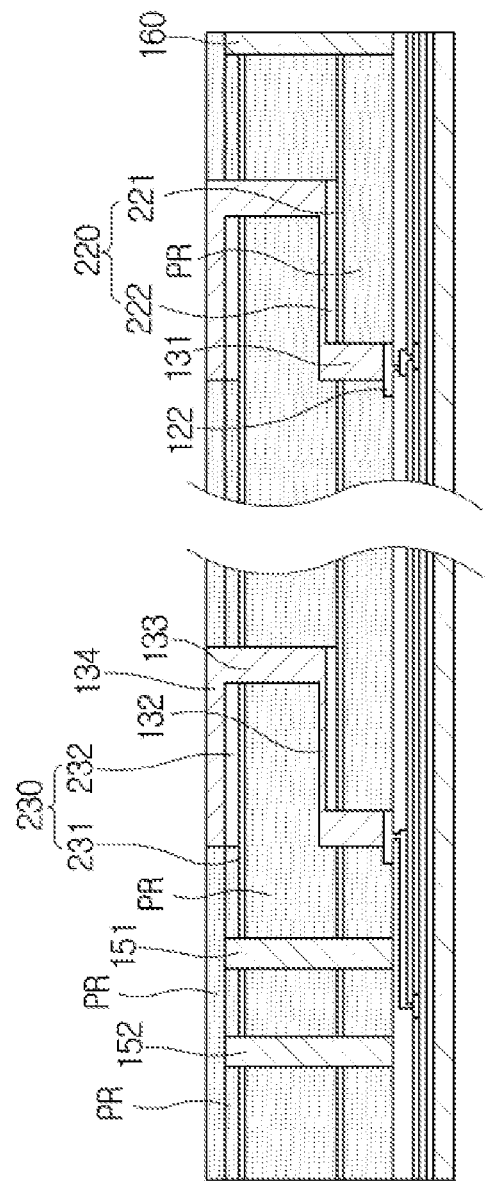

[FIG. 20]
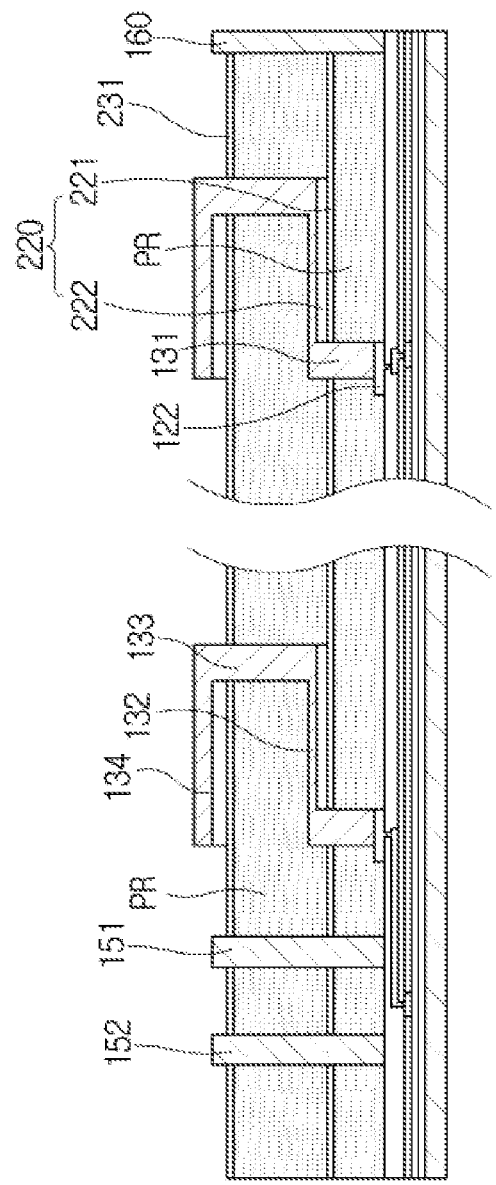

[FIG. 21]
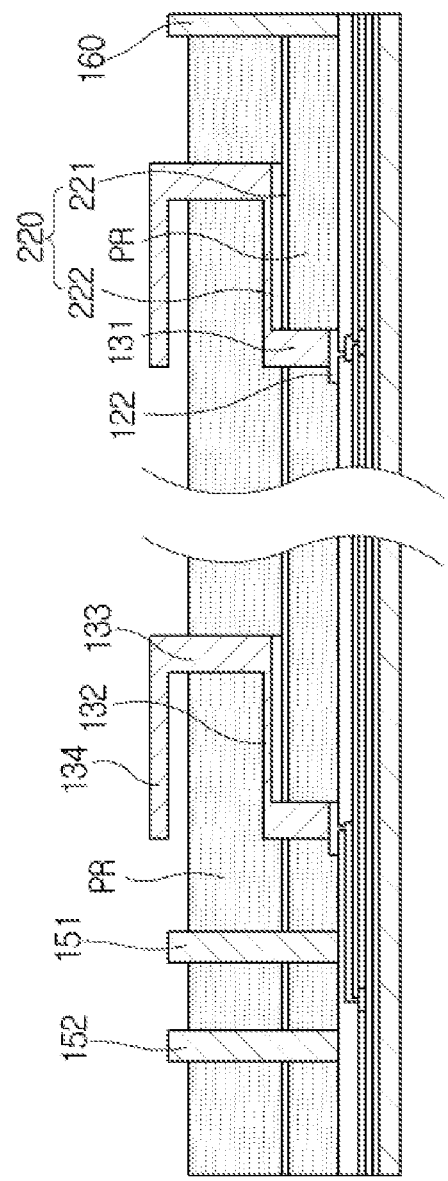

[FIG. 22]
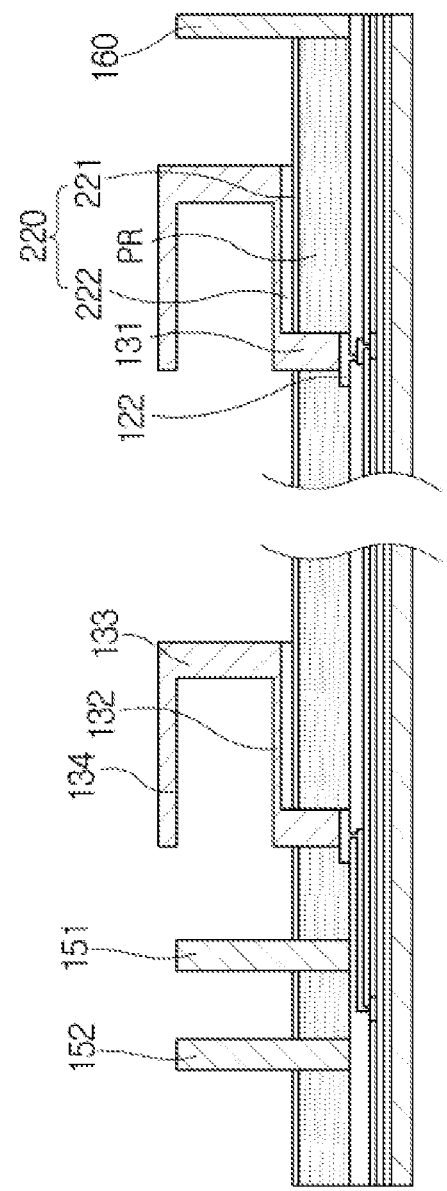

[FIG. 23]
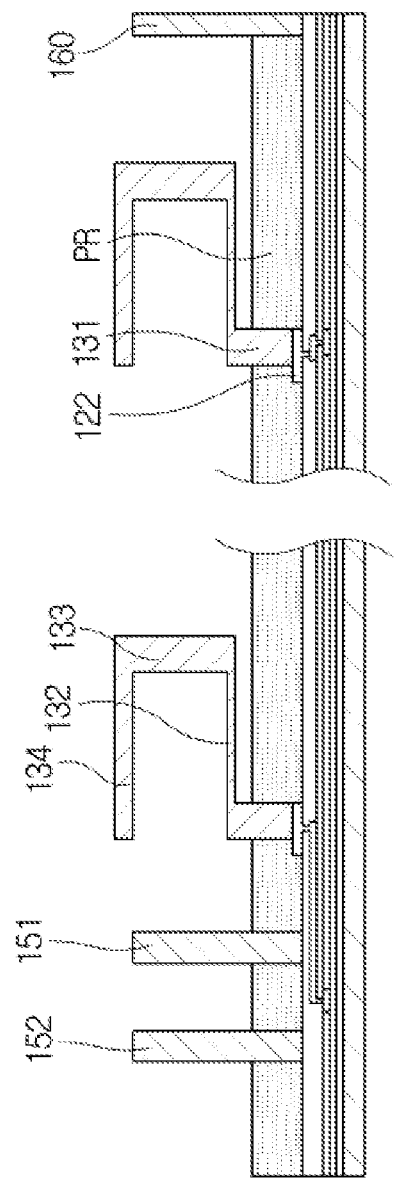

[FIG. 24]
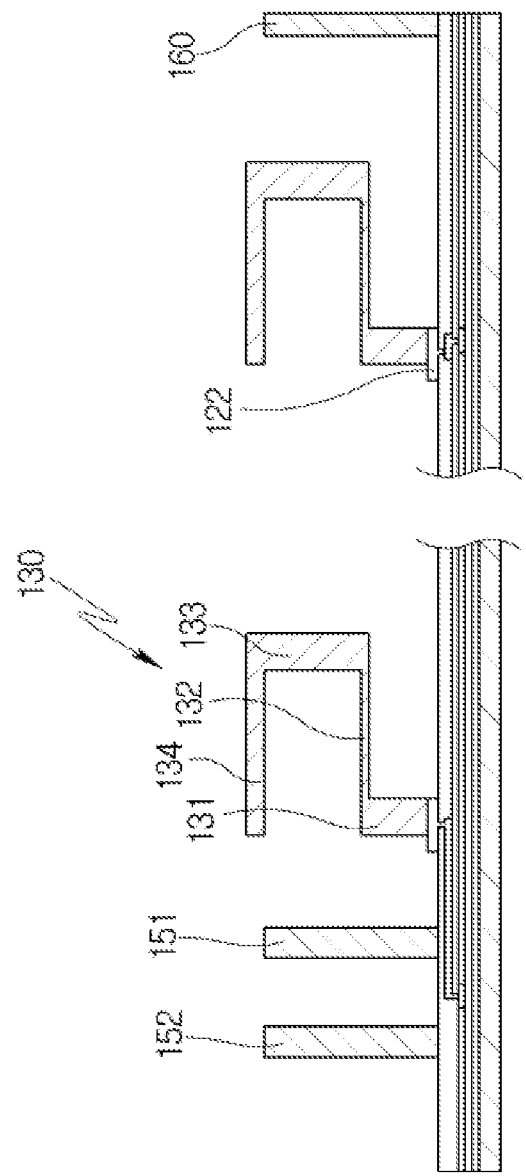

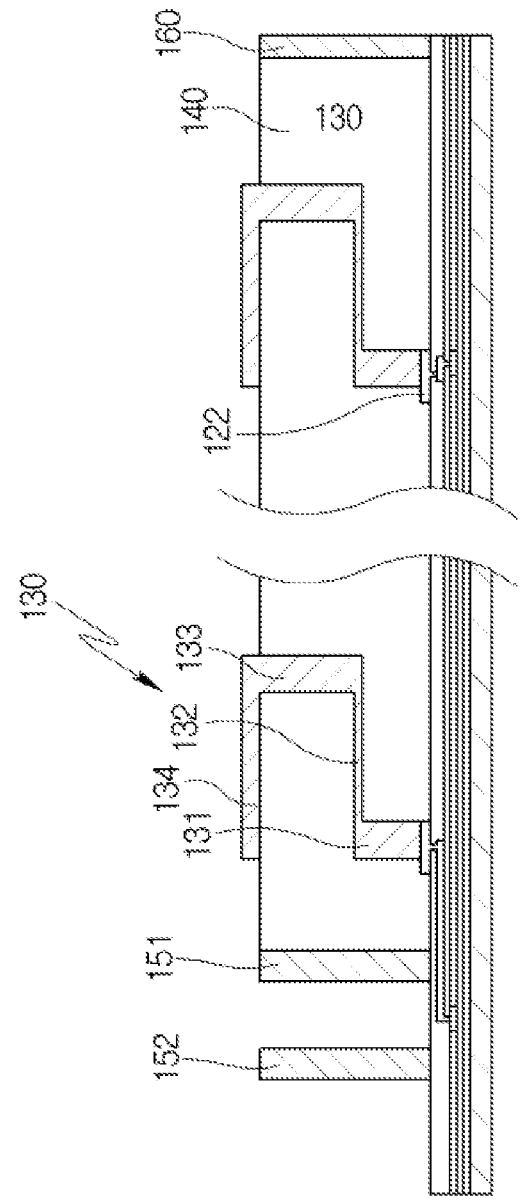
[FIG. 25]

[FIG. 26]
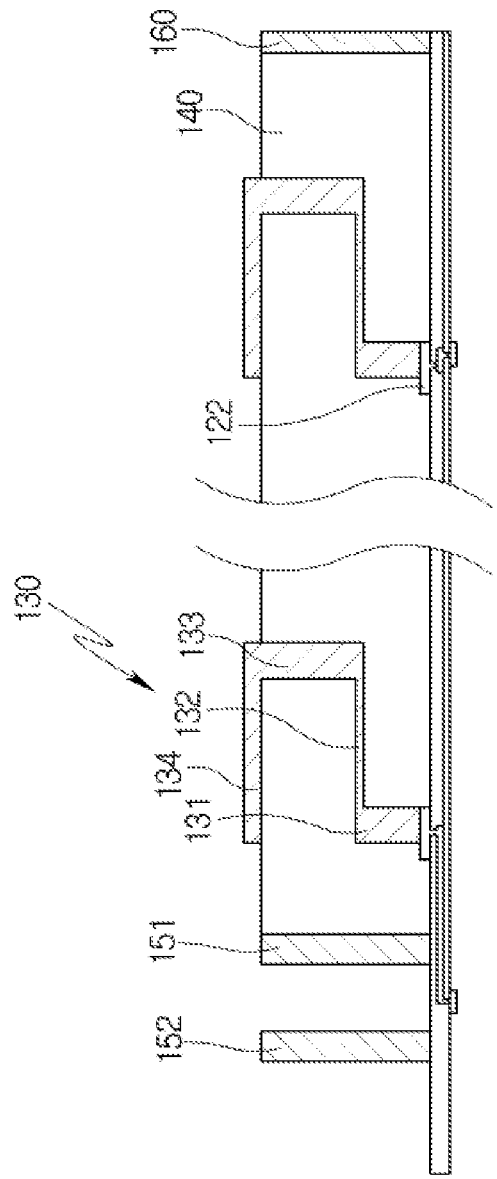

SEMICONDUCTOR DEVICE TEST SOCKET

RELATED APPLICATIONS

The present invention is a U.S. National Stage under 35 USC 371 patent application, claiming priority to Serial No. PCT/KR2016/013983, filed on 30 Nov. 2016; which claims priority of KR 10-2016-0048763, filed on 21 Apr. 2016, the entirety of both of which are incorporated herein by reference.

TECHNICAL FIELD

The present invention relates to a test socket for a semiconductor device that tests electrical reliability of the semiconductor device, and more particularly to, a test socket for a semiconductor device capable of corresponding to a fine pitch.

BACKGROUND ART

After a semiconductor device is manufactured, various tests are performed to confirm reliability of a product. For example, various tests include an electrical characteristic test for testing whether the semiconductor device is normally operated or disconnected by connecting all input/output terminals of the semiconductor device to a test signal generating circuit, and a burn-in test for checking the lifetime of the semiconductor device and an occurrence of defects thereof by connecting some input/output terminals such as a power input terminal and the like of the semiconductor device with the test signal generating circuit to apply a stress at a higher temperature, voltage, and current than a normal operating condition to the semiconductor device.

Typically, the reliability test is performed in a state in which the semiconductor device is mounted on a test socket. A shape of the test socket is basically determined depending on the form of the semiconductor device, and serves as a medium connecting the semiconductor device and test equipment with each other by a physical or electrical contact between external connection terminals of the semiconductor device and electrodes of the test socket.

In order to perform such a test process, the semiconductor device is conventionally tested using a pogo pin type test socket, but the pogo pin may damage the external connection terminals of the semiconductor device, which may cause a phenomenon that a signal flow between the semiconductor device and the test equipment does not smooth.

In addition, in accordance with recent trends in an electronics industry, there is a demand for the semiconductor device having a light weight, a small size, a high speed, a high performance, and a high reliability, and accordingly, the test socket capable of corresponding to a fine pitch is required, but the conventional pogo pin type test socket has a limitation in this respect.

In addition, solder balls of a BGA package are in contact with the socket pin in a pogo pin contact manner, but has a problem that contact resistance varies greatly depending on a contact degree of the pogo pin with respect to the solder ball. For example, the contact resistance greatly varies from several tens of mΩ to several hundreds of mΩ. The above-mentioned problem is a fundamental problem caused by the characteristics of the pogo pin itself which performs a soft contact inside the pogo pin. Such contact resistance serves as noise in the test process, and serves as a factor to lower the high frequency signal transmission characteristics.

DISCLOSURE

Technical Problem

An embodiment of the present invention is directed to providing a test socket for a semiconductor device capable of improving test reliability by smoothly performing an electrical connection with test equipment by a physical or electrical contact with the semiconductor device.

Further, an embodiment of the present invention is directed to providing a test socket for a semiconductor device capable of corresponding to a fine pitch of external connection terminals of a semiconductor device.

The objects of the present invention are not limited to those described above, and other objects and advantages of the present invention which are not mentioned may be understood by the following description.

Technical Solution

In one general aspect, a test socket for electrical connection between a semiconductor device and a test board, the test socket includes: a base layer having a first surface and a second surface opposing the first surface, and including external connection pads formed at a pitch corresponding to electrode terminals of the test board on the second surface; a plurality of circuit patterns formed to be partially exposed onto a surface of the base layer and rearranged at a pitch corresponding to the external connection pads; a plurality of electrode patterns formed on the first surface to be electrically connected to the circuit patterns and external connection terminals of the semiconductor device, and disposed at a pitch corresponding to the external connection terminals; and an elastic layer surrounding the electrode patterns so that portions of the electrode patterns are exposed.

The base layer may be formed of a polyimide material.

The circuit patterns may include first circuit patterns rearranged to be electrically connected to the external connection pads, and second circuit patterns of which portions are exposed onto the first surface of the base layer so as to be electrically connected to the first circuit patterns and the electrode patterns.

The electrode patterns may include first electrode patterns electrically connected to the circuit patterns, second electrode patterns of the form of a beam electrically connected to the first electrode patterns, third electrode patterns electrically connected to the second electrode patterns, and fourth electrode patterns electrically connected to the third electrode patterns and exposed in the form of the beam onto an upper surface of the elastic layer.

A material of the elastic layer may include at least one of polydimethylsiloxane (PDMS), polyurethane (PU), polyurethane acrylate (PUA), silicone rubber, and polymethylmethacrylate (PMMA).

A pitch between the external connection pad and an adjacent external connection pad may be greater than a pitch between the electrode pattern and an adjacent electrode pattern.

The test socket for a semiconductor device may further include an inner side dam and an outer side dam disposed inside and outside the elastic layer, respectively, to support the elastic layer.

The inner side dam may include a first inner side dam adjacent to the elastic layer and a second inner side dam disposed to be inwardly spaced apart from the first inner side dam.

The inner side dam may further include a plurality of connection dams connecting the first inner side dam and the second inner side dam to each other.

The test socket for a semiconductor device may further include a plurality of support dams supporting the inner side dam and the outer side dam.

An interval between the support dam and the support dam may be smaller than an interval between the connection dam and the connection dam.

In another general aspect, a manufacturing method of a test socket for electrical connection between a semiconductor device and a test board includes: a substrate preparation operation of preparing a substrate; an external connection pad formation operation of forming a plurality of external connection pads on a bottom surface of the substrate; a circuit pattern formation operation of forming a base layer on the substrate and rearranging circuit patterns for electrical connection with the external connection pads on the base layer; an electrode pattern formation operation of forming electrode patterns on the base layer so as to be electrically connected to the circuit patterns and external connection terminals of the semiconductor device; and an elastic layer formation operation of forming an elastic layer surrounding the electrode patterns on the base layer so that portions of the electrode patterns are exposed.

The circuit pattern formation operation may include a first circuit pattern formation operation of forming first circuit patterns on a first base layer so as to correspond to an interval between the external connection pads; and a second circuit pattern formation operation of forming second circuit patterns on a second base layer so as to be electrically connected to the first circuit patterns.

The base layer may be manufactured by applying a liquid polyimide material and then curing the liquid polyimide material.

The electrode pattern formation operation may include a first electrode pattern formation operation of forming first electrode patterns electrically connected to the circuit patterns; a second electrode pattern formation operation of forming second electrode patterns electrically connected to the first electrode patterns; a third electrode pattern formation operation of forming third electrode patterns electrically connected to the second electrode patterns; and a fourth electrode pattern formation operation of forming fourth electrode patterns electrically connected to the third electrode patterns and exposed onto an upper surface of the elastic layer.

The manufacturing method may further include an operation of forming an inner side dam and an outer side dam for supporting the elastic layer.

The manufacturing method may further include an operation of forming support dams for supporting the inner side dam and the outer side dam in a direction in which the inner side dam and the outer side dam face each other.

Advantageous Effects

According to the exemplary embodiment of the present invention, it is possible to perform a stable test in the test of the semiconductor device in which wirings and the like are implemented in the fine pitches and to secure the test reliability by preventing signal delay or distortion in the test of the high frequency device requiring the high speed operation.

It should be understood that the effects of the present invention are not limited to the effects described above, but include all effects that may be deduced from the detailed description of the present invention or the configuration of the invention described in the claims.

DESCRIPTION OF DRAWINGS

FIG. 1 is a plan view of a test socket according to an exemplary embodiment of the present invention.

FIG. 2 is a cross-sectional view taken along line "A-A'" of FIG. 1.

FIGS. 3 to 9 are cross-sectional views sequentially illustrating a process of manufacturing a base layer and a circuit pattern of a method for manufacturing a test socket according to an exemplary embodiment of the present invention.

FIGS. 10 to 26 are cross-sectional views sequentially illustrating a process of manufacturing an electrode pattern and an elastic layer of the method for manufacturing a test socket according to an exemplary embodiment of the present invention.

BEST MODE

Hereinafter, the present invention will be described with reference to the accompanying drawings. However, the present invention may be implemented in several different forms and is not limited to exemplary embodiments described in the present specification. In addition, in the drawings, portions unrelated to the description will be omitted to obviously describe the present invention, and similar portions will be denoted by similar reference numerals throughout the specification.

Throughout the present specification, when any one part is referred to as being "connected to" another part, it means that any one part and another part are "directly connected to" each other or are "indirectly connected to" each other with the other member interposed therebetween. Unless explicitly described to the contrary, "including" any component will be understood to imply the further inclusion of other components rather than the exclusion of other components.

Hereinafter, exemplary embodiments of the present invention will be described in detail with reference to the accompanying drawings.

FIG. 1 is a plan view of a test socket according to an exemplary embodiment of the present invention and FIG. 2 is a cross-sectional view taken along line "A-A'" of FIG. 1.

Referring to FIGS. 1 and 2, a test socket 100 for a semiconductor device according to an exemplary embodiment of the present invention includes a base layer 110 mounted on a test board electrically connected to semiconductor test equipment, a circuit pattern 120 formed in the base layer 110, a plurality of electrode patterns formed on the base layer 110, and an elastic layer 140 elastically supporting the electrode patterns.

The base layer 110 may include a first surface 110a and a second surface 110b opposing the first surface, and may be formed in a substantially rectangular shape in a plane view. Electrode patterns 130 and an elastic layer 140 may be formed on the first surface 110a, and the second surface 110b may be seated on a test board (not shown).

The base layer 110 may be formed of, for example, a ceramic material or a polyimide (PI) material. In a case in which the base layer 110 is manufactured using the ceramic material, a manufacturing time of the base layer 110 may increase and a price burden may increase due to an expensive ceramic material. Therefore, according to an exemplary embodiment, it is preferable to form the base layer 110 with the polyimide (PI) material that exhibits performance similar to that of the ceramic material, may shorten the manufacturing time, and is relatively inexpensive. Polyimide (PI) represents a general term of a heat-resistant resin having an imide bond (—CO—NH—CO—) in a main chain thereof, and the characteristic of such a polyimide (PI) material is high heat resistance, and particularly, has an advantage that characteristics are not aged even when used for a long time at a high temperature. In addition, the ceramic material may have a different thermal expansion coefficient from a semiconductor wafer, and accordingly, there is a difficulty to make the base layer 110 correspond to the semiconductor wafer, but the polyimide (PI) material may overcome the above-mentioned problem due to the high heat resistance thereof.

A plurality of external connection pads 114 may be formed on the second surface 110b of the base layer 110. The respective external connection pads 114 may be electrically connected to the circuit patterns 120 and the electrode terminals of the test board. The external connection pads 114 may be disposed at regular intervals or irregular intervals.

A plurality of circuit patterns 120 formed of a conductive material may be formed in the base layer 110 by a MEMS method. The circuit patterns 120 may be electrically connected to the electrode patterns 130 and the external connection terminals of the semiconductor device. The plurality of circuit patterns 120 may be formed at regular intervals or irregular intervals.

Each of the circuit patterns 120 may include, for example, a first circuit pattern 121 formed in the base layer 110 and electrically connected to the external connection pad 114, and a second circuit pattern 122 of which one end is electrically connected to the first circuit pattern 121 and the other end is exposed onto the base layer 110 to be electrically connected to the electrode pattern 130. The first circuit pattern 121 is rearranged so that the external connection terminal of a fine pitch in the semiconductor device is connected to the electrode terminal on a general-purpose test board. The arrangement form, position, and the like of the first circuit patterns 121 may be variously changed depending on the position, structure, and the like of the external connection terminals of the semiconductor device to be tested. The first circuit pattern 121 may be formed of a conductive metal, for example, copper (Cu) or gold (Au), and the second circuit pattern 122 may be formed of nickel (Ni) or nickel-cobalt alloy (Ni—Co) for connection and support with the electrode pattern 130.

A plurality of electrode patterns 130 may be formed on the first surface 110a of the base layer 110, may be formed of a conductive material so as to be electrically connected to the circuit patterns 120 and the external connection terminals of the semiconductor device, and may be formed by a MEMS method. The plurality of electrode patterns 130 may be formed at regular intervals or irregular intervals.

Each of the electrode patterns 130 may include, for example, a first electrode pattern 131 electrically connected to the circuit pattern 120, a second electrode pattern 132 electrically connected to the first electrode pattern 131 and formed in the form of a beam, a third electrode pattern 133 electrically connected to the second electrode pattern 132, and a fourth electrode pattern 134 electrically connected to the third electrode pattern 133 and exposed onto an upper surface of the elastic layer 140. The external connection terminal of the semiconductor device to be tested may be in physical or electrical contact with a surface of the fourth electrode pattern 134. Nickel (Ni), nickel-cobalt alloy (Ni—Co), or the like may be used as the conductive material used for the electrode pattern 130 so as to provide a stable function against external factors such as oxidation.

The electrode pattern 130 is formed to be encapsulated by the elastic layer 140 except for a portion thereof. That is, the first to third electrode patterns may be encapsulated by the elastic layer 140, and the fourth electrode patterns 134 may be exposed to the outside of the elastic layer 140 and be electrically connected to the external connection terminals of the semiconductor device. The elastic layer 140 may have a height equal to the height of an inner side dam and an outer side dam to be described later, and the height of the elastic layer 140 may be formed to correspond to a bottom surface of the fourth electrode pattern 134. The elastic layer 140 may be formed of a material capable of imparting elastic force to the electrode patterns so as to improve connection reliability between the electrode patterns 130 and the external connection terminals of the semiconductor device, for example, various synthetic rubbers and resins such as polydimethylsiloxane (PDMS), polyurethane (PU), polyurethane acrylate (PUA), silicone rubber, and polymethylmethacrylate (PMMA). Therefore, the elastic layer 140 may minimize damage of the external connection terminals when the electrode patterns and the external connection terminals of the semiconductor element are in contact with each other for testing, thereby improving test reliability. That is, in a case in which the external connection terminals of the semiconductor device moved by external pressure are in contact with the electrode patterns, the external connection terminals are in surface contact with the fourth electrode patterns 134 and are elastically supported by the elastic layer 140, thereby making it possible to minimize the damage to the external connection terminals.

In the test socket according to an exemplary embodiment, a pitch between the external connection pad 114 and an adjacent external connection pad 114 may be greater than a pitch between the electrode pattern and an adjacent electrode pattern. That is, since the electrode patterns are formed at a pitch corresponding to the external connection terminals of the semiconductor device for implementing a small size and miniaturization, there may be a restriction on conducting the test by directly connecting the electrode patterns to the test board. Therefore, the external connection pads 114 are rearranged to correspond to the electrode terminals of the test board and to have a pitch greater than the pitch between the electrode patterns, thereby making it possible to perform a more reliable test of the semiconductor device.

The test socket according to an exemplary embodiment may further include an inner side dam 150 and an outer side dam 160 which are disposed inside and outside the elastic layer 140, respectively, to stably support the elastic layer 140. The inner side dam 150 and the outer side dam 160 may be formed of, for example, Ni, Ni—Co alloy, or the like.

The inner side dam 150 may be formed between a first region (I) and a second region (II) of the base layer 110. The inner side dam 150 may have a height corresponding to the height of the electrode pattern 130 or lower than that of the electrode pattern 130. For example, an upper end of the inner side dam 150 may be formed to have the same height as the bottom surface of the fourth electrode pattern 134.

A plurality of inner side dams 150 may be formed and be disposed to be spaced apart from each other. For example, the inner side dam 150 may include a first inner side dam 151 and a second inner side dam 152, and the first inner side dam 151 and the second inner side dam 152 may have a sufficient spaced distance. The first inner side dam 151 and the second inner side dam 152 may be connected to each other by a connection dam 170. The connection dams 170 may be disposed at regular intervals or irregular intervals.

The outer side dam 160 may be formed between the second region (∥) and a third region (∥∥) of the base layer 110. A plurality of outer side dams 160 may be formed in the same manner as the inner side dams, and the outer side dams 160 may have the same height as that of the inner side dams 150. A support dam 180 may be each formed in a direction in which the first inner side dam 151 and the outer side dam 160 face each other. The support dam 180 may include a first support dam 181 and a second support dam 182. The first support dam 181 and the second support dam 182 may be disposed at regular intervals or irregular intervals. An interval between the first support dam 181 and the first support dam 181, and an interval between the second support dam 182 and the second support dam 182 may be smaller than an interval between the connection dam 170 and the connection dam 170. For example, the interval between the first support dams and the interval between the second support dams may be half of the interval between the connection dams.

FIGS. 3 to 9 are cross-sectional views sequentially illustrating a process of manufacturing a base layer 110 and a circuit pattern of a method for manufacturing a test socket according to an exemplary embodiment of the present invention. FIGS. 3 to 9 are illustrated on the basis of a cut line "A-A'" in FIG. 1. The following processes may be performed by a MEMS method.

Referring to FIG. 3, a base substrate 200 is prepared. As the base substrate 200, an insulator substrate such as ceramic or glass may be used. In this case, a process of removing foreign materials adhered to the base substrate 200 by cleaning and drying a surface of the base substrate 200 may be further included.

Referring to FIG. 4, a first seed layer 210 is formed on the base substrate 200 using sputtering, electroplating, chemical vapor deposition (CVD), or the like. The first seed layer may be formed to have a thickness of 1 µm to 2 µm. The first seed layer may be formed of at least one of copper (Cu), titanium (Ti), and chromium (Cr). In addition, the first seed layer 210 may be formed in a multilayer structure of a lower layer 211 and an upper layer 212, and the lower layer 211 may be formed of titanium (Ti) or chromium (Cr) and the upper layer 212 may be formed of copper (Cu).

Referring to FIGS. 5 and 6, external connection pads 114 are formed on a surface of the first seed layer 210. For example, a photo resist is applied onto the surface of the first seed layer 210, pad holes are formed along a mask pattern so that the first seed layer 210 of the portions at which the external connection pads are to be formed is exposed, and the external connection pads 114 may be then formed in the pad holes using Ni or Ni—Co plating. After the external connection pads 114 are formed, the photo resist may be removed by etching or the like.

Referring to FIG. 7, a sacrificial layer 300 together with the external connection pads 114 may be formed on the surface of the first seed layer 210. For example, the sacrificial layer 300 may be formed by removing the photo resist around the external connection pads 114 and performing electroplating for the first seed layer and surfaces of the external connection pads 114. Next, upper surfaces of the external connection pads 114 are exposed externally by a polishing and planarization process. The sacrificial layer 300 may be formed of, for example, copper. Next, a lapping process of removing the sacrificial layer deposited on the upper surfaces of the external connection pads 114 may be performed to expose the upper surfaces of the external connection pads 114.

Referring to FIG. 8, a first base layer 111 and a first circuit pattern 121 are formed on the sacrificial layer 300 and the upper surfaces of the external connection pads 114. The first base layer 111 may be formed of a polyimide (PI) material. For example, the first base layer 111 may be formed by applying a liquid polyimide (PI) material and then curing the applied liquid polyimide (PI) material. Alternatively, the first base layer may be formed by pressing a solid polyimide (PI) material on the surface of the sacrificial layer 300.

The first circuit pattern 121 is formed in the first base layer 111 so that an upper portion thereof is exposed onto the first base layer and a lower portion thereof is electrically connected to the external connection pad 114. For example, the first circuit pattern 121 may be formed by etching the first base layer 111 of a portion corresponding to the external connection pad 114 along the mask pattern to form a pattern hole in a portion at which the first circuit pattern 121 is to be formed, and depositing a Cu or Au material in the pattern hole by a method such as electroplating. The first circuit pattern 121 may have, for example, a cross section such as a shape of "T", "¬", or the like. The first circuit pattern may serve as a rearrangement pattern for subsequent electrical connection between the external connection pad and the electrode pattern by increasing or decreasing a height and length thereof, if necessary.

Referring to FIG. 9, a second base layer 112 is formed by applying a polyimide (PI) material on the first base layer 111.

In addition, a second circuit pattern 122 formed of a Ni or Ni—Co material is formed so that an upper portion thereof is exposed onto the second base layer 112 and a lower portion thereof is electrically connected to the upper portion of the first circuit pattern 121. The second circuit pattern 122 may have, for example, a cross section such as a shape of "T", "¬", or the like, and an upper portion thereof may be electrically connected to the electrode pattern.

FIGS. 10 to 26 are cross-sectional views sequentially illustrating a process of manufacturing an electrode pattern 130 and an elastic layer 140 of the method for manufacturing a test socket according to an exemplary embodiment of the present invention. FIGS. 10 to 26 are illustrated on the basis of the cut line "A-A'" in FIG. 1. The following processes may be performed by a MEMS method.

Referring to FIG. 10, a first electrode pattern 131 is formed on the base layer, particularly, on the second base layer 112. For example, pattern holes and dam holes are formed by applying a first PR onto a surface of the second base layer 112 and etching the PR of portions at which the first electrode pattern 131 and a dam are to be formed along the mask pattern. The pattern holes are formed at positions connected to the second circuit patterns, and the first electrode patterns 131 are formed in the pattern holes by electroplating Ni or Ni—Co alloy. In addition, an inner side dam and an outer side dam are formed in the dam holes by electroplating a material for the inner side dam and the outer side dam. Hereinafter, since the process of forming the inner side dam and the outer side dam is similar to the process of forming the electrode pattern, an additional description will be omitted.

Referring to FIGS. 11 to 13, a second seed layer 220 is formed on an upper surface of the first PR. For example, the first PR is removed to a predetermined height so that the upper portion of the first electrode pattern 131 is exposed. Next, a lower layer 221 of the second seed layer is formed on the first PR. Next, a second PR is applied onto a surface of the lower layer 221 of the second seed layer, the second PR is removed so that an upper end of the first electrode pattern 131 and a portion around the upper end of the first electrode pattern 131 are exposed, and an upper layer 222 is then formed on the lower layer 221 exposed by removing the second PR so as to be electrically connected to the first electrode pattern 131.

Referring to FIG. 14, a second electrode pattern 132 is formed on the exposed upper surface of the first electrode pattern 131 and an upper surface of the upper layer 222 so as to be electrically connected to the first electrode pattern 131. In addition, a third PR is applied onto the second seed layer 220 including the first electrode pattern 131 and the second electrode pattern 132.

Referring to FIG. 15, a third electrode pattern 133 is formed to be electrically connected to the second electrode pattern 132. For example, a fourth PR is applied onto the third PR and the upper surface of the second electrode pattern 132, and the third electrode pattern 133 is formed to be electrically connected to the second electrode pattern 132. For example, the third electrode pattern 133 may be formed by applying the fourth PR on the surface of the third PR, removing the surface of the second electrode pattern 132 at the portion on which the third electrode pattern is to be formed with an etching solution using a mask, and then electroplating nickel or the like.

Referring to FIGS. 16 to 18, a third seed layer 230 is formed on an upper surface of the fourth PR. After the fourth PR is removed so that an upper end of the third electrode pattern 133 is exposed, a lower layer 231 of the third seed layer is formed. Next, the fourth PR is removed so that the upper end of the third electrode pattern 133 and a portion around the upper end of the third electrode pattern 133 are exposed. Next, the fourth PR is removed so as to be electrically connected to the third electrode pattern 133, and an upper layer 232 is formed on the lower layer 231 of the exposed third seed layer.

Referring to FIG. 19, a fourth electrode pattern 134 is formed on the fourth PR to be electrically connected to the third electrode pattern 133. For example, after a fifth PR is applied onto the third seed layer 230 and the third electrode pattern 133, the fifth PR is removed so that the third electrode pattern 134 and a periphery of the third electrode pattern are exposed, and the fourth electrode pattern 134 is formed on an upper surface of the exposed third electrode pattern 133 and an upper surface of the upper layer 232 of the third seed layer.

Referring to FIGS. 20 to 24, the PRs and the seed layers except for the electrode patterns are removed in the stacked inverse order. For example, only the electrode patterns are formed on the base layer by removing the fifth PR, removing the third seed layer, removing the fourth PR and the third PR, removing the second seed layer, and then removing the second PR and the first PR.

Referring to FIG. 25, an elastic layer 140 is formed to surround the electrode pattern 130 and to elastically support the electrode pattern. For example, the elastic layer 140 may be formed by injecting a liquid elastic layer 140 material into the first inner side dam 151 and the outer side dam 160 and then sintering and curing the liquid elastic layer 140 material. The elastic layer 140 may be formed of a PDMS material.

Referring to 26, the manufacturing of the test socket is completed by separating the base layer 110 formed on the base substrate 200 via the sacrificial layer from the base substrate 200.

In the test socket manufactured as described above, since the electrode patterns 130 are elastically supported by the elastic layer 140, it is possible to minimize the occurrence of damage to the external connection terminals when the electrode patterns are in contact with the external connection terminals of the semiconductor device, and even in a case in which the external connection terminals are formed at a fine pitch, since the electrode patterns 130 are stably and correspondingly connected to the external connection terminals through the general-purpose test board by the circuit patterns 120 rearranged on the base layer 110 to perform the test, test reliability may be increased.

The foregoing description of the present invention is intended to be illustrative, and it will be understood by those skilled in the art that various changes in form and details may be made therein without departing from the spirit and scope of the invention as defined by the appended claims.

That is, it is to be understood that exemplary embodiments described hereinabove are illustrative rather than being restrictive in all aspects. For example, each component described as a single form may be distributed, and components described as being distributed may also be implemented in a combined form.

Therefore, it is to be understood that the scope of the present invention will be defined by the claims rather than the above-mentioned description, and all modifications and alternations derived from the claims and their equivalents are included in the scope of the present invention.

DETAILED DESCRIPTION OF MAIN ELEMENTS

100: test socket
110: base layer 111: first base layer
112: second base layer 114: external connection pad
120: circuit pattern 121: first circuit pattern
122: second circuit pattern
130: electrode pattern 131: first electrode pattern
132: second electrode pattern 133: third electrode pattern
134: fourth electrode pattern
140: elastic layer 150: inner side dam
160: outer side dam 170: connection dam
180: support dam
200: base substrate 210: first seed layer
220: second seed layer 230: third seed layer
300: sacrificial layer

The invention claimed is:

1. A test socket for electrical connection between a semiconductor device and a test board, the test socket comprising:

a base layer having a first surface and a second surface opposing the first surface, and including external connection pads formed at a pitch corresponding to electrode terminals of the test board on the second surface;

a plurality of circuit patterns formed to be partially exposed onto a surface of the base layer and rearranged at a pitch corresponding to the external connection pads;

a plurality of electrode patterns formed on the first surface to be electrically connected to the circuit patterns and external connection terminals of the semiconductor device, and disposed at a pitch corresponding to the external connection terminals; and an elastic layer surrounding the electrode patterns so that portions of the electrode patterns are exposed, wherein the plurality of electrode patterns includes first electrode patterns electrically connected to the circuit patterns, second electrode patterns of the form of a beam electrically connected to the first electrode patterns, third electrode patterns electrically connected to the second electrode patterns, and fourth electrode patterns electrically connected to the third electrode patterns and exposed in the form of the beam onto an upper surface of the elastic layer.

2. The test socket for a semiconductor device of claim 1, wherein the base layer is formed of a polyimide material.

3. The test socket for a semiconductor device of claim 1, wherein the circuit patterns include:
   first circuit patterns rearranged to be electrically connected to the external connection pads, and
   second circuit patterns of which portions are exposed onto the first surface of the base layer so as to be electrically connected to the first circuit patterns and the electrode patterns.

4. The test socket for a semiconductor device of claim 1, wherein a material of the elastic layer includes at least one of polydimethylsiloxane (PDMS), polyurethane (PU), polyurethane acrylate (PUA), silicone rubber, and polymethylmethacrylate (PMMA).

5. The test socket for a semiconductor device of claim 1, wherein a pitch between the external connection pad and an adjacent external connection pad is greater than a pitch between the electrode pattern and an adjacent electrode pattern.

6. The test socket for a semiconductor device of claim 1, further comprising an inner side dam and an outer side dam disposed inside and outside the elastic layer, respectively, to support the elastic layer.

7. A test socket for electrical connection between a semiconductor device and a test board, the test socket comprising:
   a base layer having a first surface and a second surface opposing the first surface, and including external connection pads formed at a pitch corresponding to electrode terminals of the test board on the second surface;
   a plurality of circuit patterns formed to be partially exposed onto a surface of the base layer and rearranged at a pitch corresponding to the external connection pads;
   a plurality of electrode patterns formed on the first surface to be electrically connected to the circuit patterns and external connection terminals of the semiconductor device, and disposed at a pitch corresponding to the external connection terminals;
   an elastic layer surrounding the electrode patterns so that portions of the electrode patterns are exposed; and
   an inner side dam and an outer side dam disposed inside and outside the elastic layer, respectively, to support the elastic layer, the inner side dam comprising a first inner side dam and a second inner side dam, wherein the first inner side dam is adjacent to the elastic layer and the second inner side dam is disposed to be inwardly spaced apart from the first inner side dam.

8. The test socket for a semiconductor device of claim 7, wherein the inner side dam further includes a plurality of connection dams connecting the first inner side dam and the second inner side dam to each other.

9. The test socket for a semiconductor device of claim 8, further comprising a plurality of support dams supporting the inner side dam and the outer side dam.

10. The test socket for a semiconductor device of claim 9, wherein an interval between the support dam and the support dam is smaller than an interval between the connection dam and the connection dam.

11. A manufacturing method of a test socket for electrical connection between a semiconductor device and a test board, the manufacturing method comprising:
   a substrate preparation operation of preparing a substrate;
   an external connection pad formation operation of forming a plurality of external connection pads on a bottom surface of the substrate;
   a circuit pattern formation operation of forming a base layer on the substrate and rearranging circuit patterns for electrical connection with the external connection pads on the base layer;
   an electrode pattern formation operation of forming electrode patterns on the base layer so as to be electrically connected to the circuit patterns and external connection terminals of the semiconductor device, wherein the electrode pattern formation operation comprises:
      a first electrode pattern formation operation of forming first electrode patterns electrically connected to the circuit patterns;
      a second electrode pattern formation operation of forming second electrode patterns electrically connected to the first electrode patterns;
      a third electrode pattern formation operation of forming third electrode patterns electrically connected to the second electrode patterns; and
      a fourth electrode pattern formation operation of forming fourth electrode patterns electrically connected to the third electrode patterns and exposed onto an upper surface of an elastic layer; and
   an elastic layer formation operation of forming the elastic layer surrounding the electrode patterns on the base layer so that portions of the electrode patterns are exposed.

12. The manufacturing method of claim 11, wherein the circuit pattern formation operation includes:
   a first circuit pattern formation operation of forming first circuit patterns on a first base layer so as to correspond to an interval between the external connection pads; and
   a second circuit pattern formation operation of forming second circuit patterns on a second base layer so as to be electrically connected to the first circuit patterns.

13. The manufacturing method of claim 11, wherein the base layer is manufactured by applying a liquid polyimide material and then curing the liquid polyimide material.

14. The manufacturing method of claim 11, further comprising an operation of forming an inner side dam and an outer side dam for supporting the elastic layer.

15. The manufacturing method of claim 14, further comprising an operation of forming support dams for supporting the inner side dam and the outer side dam in a direction in which the inner side dam and the outer side dam face each other.

* * * * *